US009653634B2

United States Patent
Sherman

(10) Patent No.: US 9,653,634 B2
(45) Date of Patent: *May 16, 2017

(54) INTERLOCKING EDGES HAVING ELECTRICAL CONNECTORS FOR BUILDING INTEGRABLE PHOTOVOLTAIC MODULES

(71) Applicant: BEIJING APOLLO DING RONG SOLAR TECHNOLOGY CO., LTD., Beijing (CN)

(72) Inventor: Adam C. Sherman, Newark, CA (US)

(73) Assignee: Beijing Apollo Ding Rong Solar Technology Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/330,557

(22) Filed: Jul. 14, 2014

(65) Prior Publication Data

US 2015/0000727 A1   Jan. 1, 2015

Related U.S. Application Data

(63) Continuation of application No. 13/043,225, filed on Mar. 8, 2011, now Pat. No. 8,796,536.

(51) Int. Cl.
*H02N 6/00* (2006.01)
*H01L 31/042* (2014.01)
(Continued)

(52) U.S. Cl.
CPC ...... *H01L 31/0483* (2013.01); *H01L 31/0201* (2013.01); *H01L 31/02013* (2013.01);
(Continued)

(58) Field of Classification Search
CPC .......... H02S 40/36; H02S 20/23; H02S 20/25; H01L 31/02; H01L 31/02008; H01L 31/0201; H01L 31/02013
See application file for complete search history.

(56) References Cited

U.S. PATENT DOCUMENTS

| 4,582,953 | A | * | 4/1986 | Nagase | .................. F24J 2/0455 136/251 |
| 4,779,948 | A | * | 10/1988 | Wais | .................... G02B 6/4292 250/227.24 |

(Continued)

OTHER PUBLICATIONS

U.S. Application titled "Interlocking Edges Having Electrical Connectors for Building Integrable Photovoltaic Modules," filed Mar. 8, 2011, U.S. Appl. No. 13/043,225.

(Continued)

*Primary Examiner* — Eli Mekhlin
(74) *Attorney, Agent, or Firm* — Weaver Austin Villeneuve & Sampson LLP

(57) ABSTRACT

Provided are novel building integrable photovoltaic (BIP) modules that are mechanically and electrically interconnectable. According to various embodiments, the modules include channels and protrusion members. A channel of one module snugly fits over a protrusion member of an adjacent module to provide a moisture seal and, in certain embodiments, to collect water in between two modules and direct it downward. In certain embodiments, a channel is configured to interlock with a protrusion member in one or more directions. The channel is positioned along one edge of the module, while the protrusion member is positioned along the opposite edge, so that BIP modules can form a continuous interconnected row. The channel and protrusion member include electrical connectors having conductive elements. Inserting a protrusion member into a channel and, in certain embodiments, sliding one with respect to another also electrically interconnects the conductive elements.

12 Claims, 10 Drawing Sheets

(51) Int. Cl.
    *H01L 31/048* (2014.01)
    *H01L 31/02* (2006.01)
    *H02S 20/25* (2014.01)
    *H02S 20/23* (2014.01)
    *H02S 40/36* (2014.01)

(52) U.S. Cl.
    CPC .............. *H02S 20/23* (2014.12); *H02S 20/25* (2014.12); *H02S 40/36* (2014.12); *Y02B 10/12* (2013.01); *Y02E 10/50* (2013.01); *Y10T 29/4921* (2015.01); *Y10T 29/49208* (2015.01)

(56) References Cited

U.S. PATENT DOCUMENTS

| | | | |
|---|---|---|---|
| 8,796,536 B1 | 8/2014 | Sherman | |
| 2006/0042680 A1* | 3/2006 | Korman | E04D 3/38 136/251 |
| 2008/0053701 A1* | 3/2008 | Antaya | H01R 4/022 174/72 B |
| 2008/0302030 A1* | 12/2008 | Stancel | H01L 31/02008 52/173.3 |
| 2009/0215304 A1 | 8/2009 | Faust et al. | |

OTHER PUBLICATIONS

Office Action issued in U.S. Appl. No. 13/043,225, dated Apr. 18, 2013.
Final Office Action issued in U.S. Appl. No. 13/043,225, dated Jul. 26, 2013, 2014.
Notice of Allowance issued in U.S. Appl. No. 13/043,225, dated Mar. 20, 2014.

\* cited by examiner

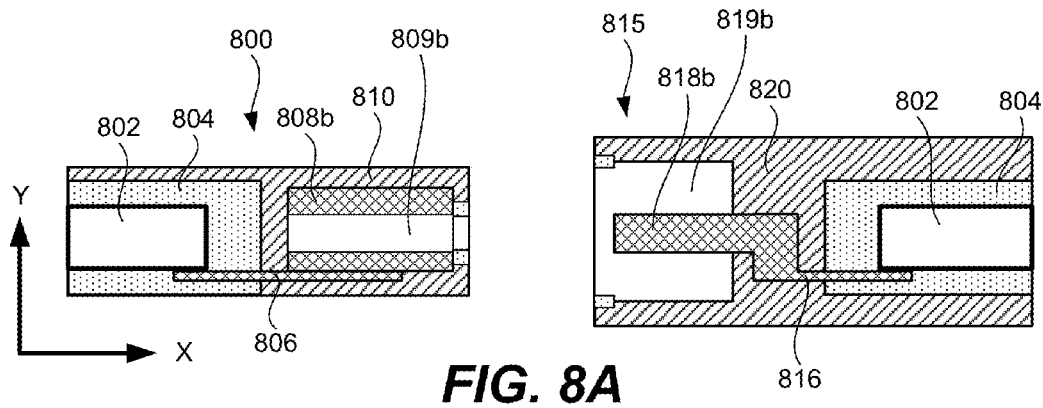
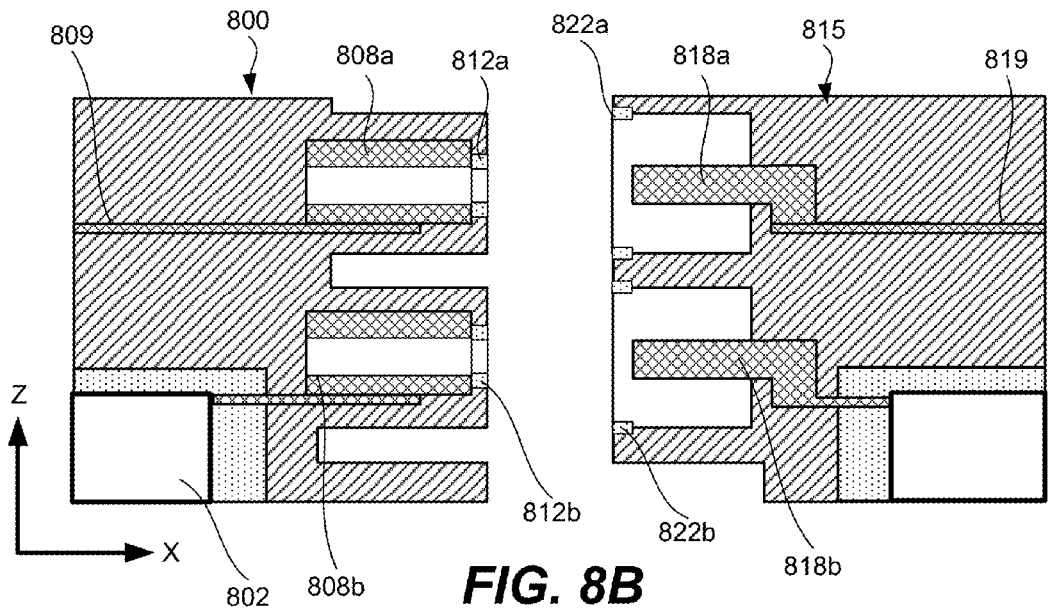
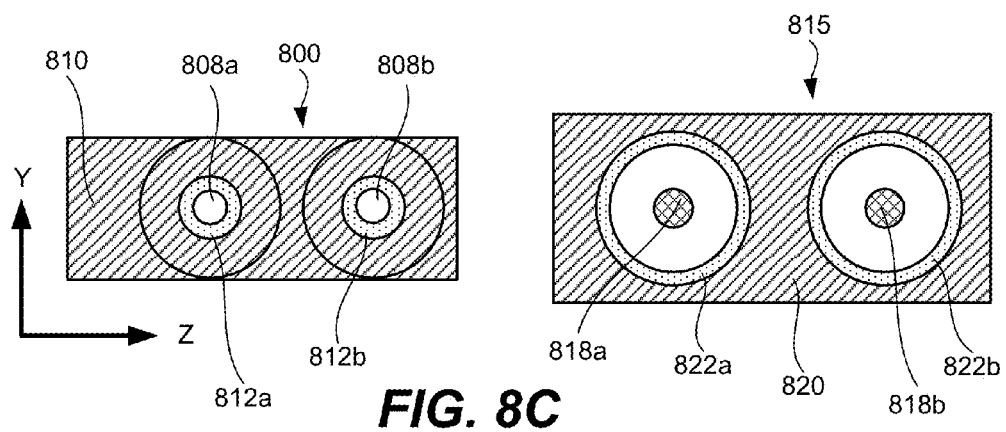
FIG. 8A
FIG. 8B
FIG. 8C

INTERLOCKING EDGES HAVING ELECTRICAL CONNECTORS FOR BUILDING INTEGRABLE PHOTOVOLTAIC MODULES

CROSS-REFERENCE TO RELATED APPLICATION

This application is a continuation of and claim priority to U.S. application Ser. No. 13/043,225 (issued as U.S. Pat. No. 8,796,536), titled "INTERLOCKING EDGES HAVING ELECTRICAL CONNECTORS FOR BUILDING INTEGRABLE PHOTOVOLTAIC MODULES," filed Mar. 8, 2011, all of which is incorporated herein by this reference for all purposes.

BACKGROUND

Photovoltaic cells are widely used for electricity generation with one or more photovoltaic cells typically sealed within and interconnected in a module. Multiple modules may be arranged into photovoltaic arrays used to convert solar energy into electricity by the photovoltaic effect. Arrays can be installed on building rooftops and are used to provide electricity to the buildings and to the general grid.

SUMMARY

Provided are novel building integrable photovoltaic (BIP) modules that are mechanically and electrically interconnectable. According to various embodiments, the modules include channels and protrusion members. A channel of one module snugly fits over a protrusion member of an adjacent module to provide a moisture seal and, in certain embodiments, to collect water in between two modules and direct it downward. In certain embodiments, a channel is configured to interlock with a protrusion member in one or more directions. The channel is positioned along one edge of the module, while the protrusion member is positioned along the opposite edge, so that BIP modules can form a continuous interconnected row. The channel and protrusion member include electrical connectors having conductive elements. Inserting a protrusion member into a channel and, in certain embodiments, sliding one with respect to another also electrically interconnects the conductive elements. After installation, the connectors are located within the channel and protected from the environment.

In certain embodiments, a BIP module includes a photovoltaic insert having a first edge and a second edge, a channel attached to the first edge, an extension member attached to the second edge, and a protrusion member attached to and extending away from the extension member. The first edge of the insert may be opposite of the second edge. The photovoltaic insert includes one or more photovoltaic cells having a front light incident side and a back side. The channel has an opening configured for receiving and snugly fitting around a protrusion member of an adjacent module. This opening generally faces in a downward direction, which extends from the front light incident side to the back side of the cells. The protrusion member extends in an upward direction (opposite of the downward direction) from the extension member and configured for inserting and snugly fitting around a channel of yet another adjacent module. A channel and a protrusion member of the BIP module can form attachments to two other modules.

A BIP module has at least two electrical connectors. One connector may be positioned within the channel and may be referred to as a "channel connector". At least one conductive element of the channel connector is in direct electrical communication with the photovoltaic cells of the module. Another connector is attached to the extension member and is configured to extend in an upward direction together with the protrusion member. Similar to the protrusion member, this connector extends into a channel of an adjacent module to make an electrical connection with the channel connector of that module. This connector may be referred to as a "protrusion connector". The protrusion connector also has at least one conductive element in direct electrical communication with the photovoltaic cells. The protrusion connector may be a part of the protrusion member or a separate physical component.

In certain embodiments, a channel of one module is configured to interlock with a protrusion member of an adjacent module when the two modules are interconnected. Interlocking may be used to prevent the channel from sliding with respect to the protrusion member in the upward direction and/or in a direction parallel to the first edge. For example, a channel and/or a protrusion member may include one or more interlocking features, such as protrusions.

In certain embodiments, an extension member may have a side moisture flap attached to it. The side moisture flap is configured to extend under an adjacent module. A moisture flap may be used to improve a moisture seal in between two interconnected modules. In certain embodiments, one or more parts of a channel and/or of a protrusion member are flexible. For example, a channel opening may be smaller than a maximum cross-sectional width of a protrusion member. When the protrusion member is inserted into the channel, a portion of the channel flex outwards or a portion of the protrusion member may flex inwards to allow this insertion. In certain embodiments, a protrusion member is itself an open channel having an opening facing in a downward direction or in an upward direction.

In certain embodiments, a channel connector may include a conductive element that is not in direct electrical communication with photovoltaic cells of the module. For example, a module may have a bus bar that extends between the first edge and the second edge without making any intra-module electrical contact to the photovoltaic cells. This bus bar may be connected to one conductive element of the channel connector and one conductive element of the protrusion connector. However, other conductive elements of the two connectors are in direct electrical communication with photovoltaic cells.

In the same or other embodiments, a conductive element of the channel connector is a pin extending out of the connector body in a direction substantially parallel to the first edge of the insert. In other embodiments, a conductive element of the channel connector is a pin extending out of the connector body in a downward direction. In either case, the pin typically does not extend outside of the channel to ensure a "touch safe" design. In yet other embodiments, a conductive element of the channel connector is a conductive surface facing the channel opening, while a conductive element of the protrusion connector includes a conductive surface facing in the upward direction. The two surfaces of adjacent modules are configured to form an electrical connection during insertion of the protrusion member into the channel.

In certain embodiments, a channel connector and/or a protrusion connector includes one or more of the following materials: polyethylene terephthalate, polybutylene terephthalate, nylon, polyphenylene sulfide, polyamide, polycarbonate, polyester, polypropylene, and polyvinyl chloride. In the same or other embodiments, a channel and/or a protrusion may be made from one or more of the following materials: polyethylene, polypropylene, thermoplastic rubber, thermoplastic elastomer, ethylene propylene diene monomer, fluoroelastomers, thermoplastic vulcanizates, and flexible cast thermoset materials. In certain embodiments, a BIP module includes two channel connectors positioned along the channel with a gap in between the two. This gap allows a protrusion connector of an adjacent module to fit into the channel in between the two channel connectors for making an electrical connection to one of them. In certain embodiments, a protrusion connector is integrated with a protrusion member. In the same or other embodiments, a channel is a part of an overmold formed around the photovoltaic insert.

Provided also is a method for installing a photovoltaic array. The array may be positioned on a building structure and may include at least two building integrable photovoltaic (BIP) modules, which will be referred to as a first module and a second module. The method may involve providing the first module that includes a protrusion member extending in a direction away from the building structure and a protrusion connector having a conductive element. The first module may be already positioned on and/or attached to the building structure. The method may continue with providing the second module that includes a channel having an opening configured for receiving and snugly fitting around the protrusion member of the first module. The channel includes an electrical connector having a conductive element. The method may proceed with positioning the channel of the second module over the protrusion member of the first module and pushing the second module towards the first module to insert the protrusion member into the channel.

In certain embodiments, insertion of the protrusion member into the channel establishes an electrical connection between conductive elements of the protrusion connector and the channel connector. In other embodiments, the method proceeds with sliding the second module with respect to the first module in a direction parallel to the length of the channel to establish an electrical connection between the two connectors. In certain embodiments, the method involves dispensing a sealing material and/or an adhesive material into a channel of the second module and/or onto a protrusion member of the first module prior to inserting the protrusion member into the channel.

These and other aspects of the invention are described further below with reference to the figures.

BRIEF DESCRIPTION OF THE DRAWINGS

FIGS. 8A-8C are schematic cross-sectional views of two connectors configured for interconnection with each other in accordance with certain embodiments.

DETAILED DESCRIPTION OF EXAMPLE EMBODIMENTS

Figure 1:
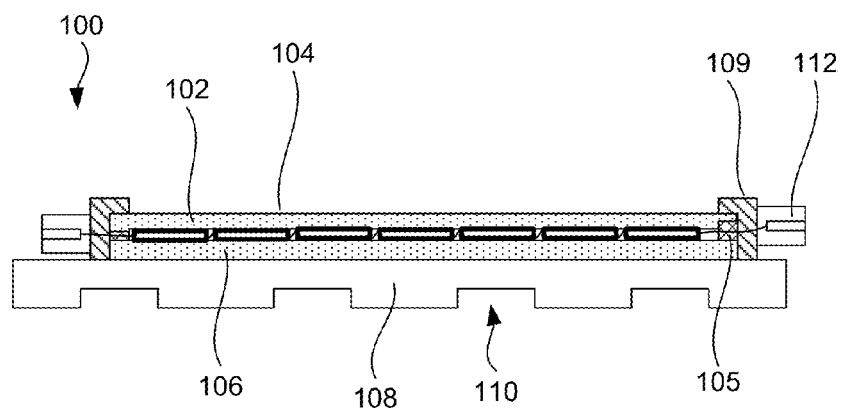
FIG. 1 is a schematic cross-sectional side view of a building integrable photovoltaic (BIP) module in accordance with certain embodiments.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Introduction

Building-integrable photovoltaic (BIP) modules are defined as specially configured photovoltaic modules that are used for integration into building structures in various parts of buildings, such as rooftops, skylights, or facades. In certain examples, BIP modules replace conventional building materials, such as asphalt shingles. Unlike traditional photovoltaic systems, BIP modules often do not require separate mounting hardware. As such, installed BIP modules provide substantial savings over more traditional systems in terms of building materials and labor costs. For example, a substantial part of traditional asphalt roof shingles may be replaced by "photovoltaic shingles." In certain embodiments, photovoltaic shingles are installed on the same base roof structures as the asphalt shingles. In fact, a rooftop may be covered by a combination of the asphalt and photovoltaic shingles. In certain embodiments, BIP modules are shaped like one or a collection of asphalt shingles. BIP modules may look and act much like the asphalt shingles while producing electricity in addition to protecting the underlying building structures from the environment. In certain embodiments, BIP modules may be about 14 (e.g., 13.25) inches by about 40 (e.g., 39.375) inches in size and may be stapled directly to the roof deck through water barrier roofing cloth, for example. Generally, only a portion of the photovoltaic shingle is exposed, while the remaining portion is covered by other shingles. The exposed portion is referred to as the "shingle exposure", while the covered portion is referred to as the "flap." For example, the shingle exposure of a 13.25 inch by 39.375 inch shingle may be only about 5 inches wide or, in some embodiments, about 5.625 inches wide. The length of the shingle exposure in some of these embodiments may be 36 inches or about 39.375 inches (if side skirts are not used, for example). Other dimensions of photovoltaic shingles may be used as well.

According to various embodiments, BIP modules described herein are configured such that an interface between two adjacent installed BIP modules is moisture tight. At the same time, this interface may be used for electrically interconnecting the modules. These electrical connections are protected from moisture and interfere with other functionalities and aesthetic appearances of the modules. Novel BIP modules described in this document have channels and protrusion members that provide both mechanical and electrical connections between the modules meeting the above listed requirements. Specifically, a channel of one module snugly fits over and, in certain embodiments, interlocks with a protrusion member of an adjacent module. The channel is typically positioned along one edge of the module, while the protrusion member is positioned along the opposite edge, so that BIP modules can form a continuous interconnected row. The channel and protrusion member include electrical connectors having conductive elements. After installation, both connectors are positioned within the channel and are protected from the environment.

To provide a better understanding of various features of BIP modules and methods of integrating connectors with photovoltaic inserts during module fabrication, some examples of BIP modules will now be briefly described. FIG. 1 is a schematic cross-sectional end view (line 1-1 in FIG. 2 indicates the position of this cross-section) of a BIP module 100 in accordance with certain embodiments. BIP module 100 may have one or more photovoltaic cells 102 that are electrically interconnected. Photovoltaic cells 102 may be interconnected in parallel, in series, or in various combinations of these. Examples of photovoltaic cells include copper indium gallium selenide (CIGS) cells, cadmium-telluride (Cd-Te) cells, amorphous silicon (a-Si) cells, micro-crystalline silicon cells, crystalline silicon (c-Si) cells, gallium arsenide multi-junction cells, light adsorbing dye cells, organic polymer cells, and other types of photovoltaic cells.

Photovoltaic cell 102 has a photovoltaic layer that generates a voltage when exposed to sunlight. In certain embodiments, the photovoltaic layer includes a semiconductor junction. The photovoltaic layer may be positioned adjacent to a back conductive layer, which, in certain embodiments, is a thin layer of molybdenum, niobium, copper, and/or silver. Photovoltaic cell 102 may also include a conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils), with other thicknesses also within the scope. Photovoltaic cell 102 may also include a top conductive layer. This layer typically includes one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers to 1,000 nanometers (e.g., between about 200 nanometers and 800 nanometers), with other thicknesses within the scope.

In certain embodiments, photovoltaic cells 102 are interconnected using one or more current collectors (not shown). The current collector may be attached and configured to collect electrical currents from the top conductive layer. The current collector may also provide electrical connections to adjacent cells as further described with reference to of FIG. 5, below. The current collector includes a conductive component (e.g., an electrical trace or wire) that contacts the top conductive layer (e.g., a TCO layer). The current collector may further include a top carrier film and/or a bottom carrier film, which may be made from transparent insulating materials to prevent electrical shorts with other elements of the cell and/or module. In certain embodiments, a bus bar is attached directly to the substrate of a photovoltaic cell. A bus bar may also be attached directly to the conductive component of the current collector. For example, a set of photovoltaic cells may be electrically interconnected in series with multiple current collectors (or other interconnecting wires). One bus bar may be connected to a substrate of a cell at one end of this set, while another bus bar may be connected to a current collector at another end.

Photovoltaic cells 102 may be electrically and environmentally insulated between a front light-incident sealing sheet 104 and a back sealing sheet 106. Examples of sealing sheets include glass, polyethylene, polyethylene terephthalate (PET), polypropylene, polybutylene, polybutylene terephthalate (PBT), polyphenylene oxide (PPO), polyphenylene sulfide (PPS) polystyrene, polycarbonates (PC), ethylene-vinyl acetate (EVA), fluoropolymers (e.g., polyvinyl fluoride (PVF), polyvinylidene fluoride (PVDF), ethylene-terafluoethylene (ETFE), fluorinated ethylene-propylene (FEP), perfluoroalkoxy (PFA) and polychlorotrifluoroethane (PCTFE)), acrylics (e.g., poly(methyl methacrylate)), silicones (e.g., silicone polyesters), and/or polyvinyl chloride (PVC), as well as multilayer laminates and co-extrusions of these materials. A typical thickness of a scaling sheet is between about 5 mils and 100 mils or, more specifically, between about 10 mils and 50 mils. In certain embodiments, a back sealing sheet includes a metallized layer to improve water permeability characteristics of the sealing sheet. For example, a metal foil may be positioned in between two insulating layers to form a composite back sealing sheet. In certain embodiments, a module has an encapsulant layer positioned between one or both sealing sheets 104, 106 and photovoltaic cells 102. Examples of encapsulant layer materials include non-olefin thermoplastic polymers or thermal polymer olefin (TPO), such as polyethylene (e.g., a linear low density polyethylene, polypropylene, polybutylene, polyethylene terephthalate (PET), polybutylene terephthalate (PBT), polystyrene, polycarbonates, fluoropolymers, acrylics, ionomers, silicones, and combinations thereof.

BIP module 100 may also include an edge seal 105 that surrounds photovoltaic cells 102. Edge seal 105 may be used to secure front sheet 104 to back sheet 106 and/or to prevent moisture from penetrating in between these two sheets. Edge seal 105 may be made from certain organic or inorganic materials that have low inherent water vapor transmission rates (WVTR), e.g., typically less than 1-2 g/m$^2$/day. In certain embodiments, edge seal 105 is configured to absorb moisture from inside the module in addition to preventing moisture ingression into the module. For example, a butyl-rubber containing moisture getter or desiccant may be added to edge seal 105. In certain embodiments, a portion of edge seal 105 that contacts electrical components (e.g., bus bars) of BIP module 100 is made from a thermally resistant polymeric material. Various examples of thermally resistant materials and RTI ratings are further described below.

BIP module 100 may also have a support sheet 108 attached to back side sealing sheet 106. The attachment may be provided by a support edge 109, which, in certain embodiments, is a part of support sheet 108. Support sheets may be made, for example, from rigid materials. Some examples of rigid materials include polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weather able engineering thermoplastics such as polyphenylene oxide (PPO), polymethyl methacrylate, polyphenylene (PPE), styrene-acrylonitrile (SAN), polystyrene and blends based on those materials. Furthermore, weatherable thermosetting polymers, such as unsaturated polyester (UP) and epoxy, may be used. The properties of these materials listed above may be enhanced with the addition of fire retardants, color pigments, anti-tracking, and/or ignition resistant materials. In addition, glass or mineral fibers powders and/or spheres may be used to enhance the structural integrity, surface properties, and/or weight reduction. The materials may also include additives such as anti-oxidants, moisture scavengers, blowing or foaming agents, mold release additives, or other plastic additives.

In certain embodiments, support sheet 108 may be attached to back sheet 106 without a separate support edge or other separate supporting element. For example, support sheet 108 and back sheet 106 may be laminated together or support sheet 108 may be formed (e.g., by injection molding) over back sheet 106. In other embodiments back sealing sheet 106 serves as a support sheet. In this case, the same element used to seal photovoltaic cells 102 may be positioned over and contact a roof structure (not shown). Support sheet 108 may have one or more ventilation channels 110 to allow for air to flow between BIP module 100 and a building surface, e.g., a roof-deck or a water resistant underlayment/membrane on top of the roof deck. Ventilation channels 110 may be used for cooling BIP module during its operation. For example, it has been found that each 1° C. of heating from an optimal operating temperature of a typical CIGS cell causes the efficiency loss of about 0.33% to 0.5%.

BIP module 100 has one or more electrical connectors 112 for electrically connecting BIP module 100 to other BIP modules and array components, such as an inverter and/or a battery pack. In certain embodiments, BIP module 100 has two electrical connectors 112 positioned on opposite sides (e.g., the short or minor sides of a rectangular module) of BIP module 100, as for example shown in FIGS. 1 and 2, for example. Each one of two electrical connectors 112 has at least one conductive element electrically connected to photovoltaic cells 102. In certain embodiments, electrical connectors 112 have additional conductive elements, which may or may not be directly connected to photovoltaic cells 102. For example, each of two connectors 112 may have two conductive elements, one of which is electrically connected to photovoltaic cells 102, while the other is electrically connected to a bus bar (not shown) passing through BIP module 100. This and other examples are described in more detail in the context of FIGS. 6 and 7. In general, regardless of the number of connectors 112 attached to BIP module 100, at least two conductive elements of these connectors 112 are electrically connected to photovoltaic cells 102.

Figure 2:
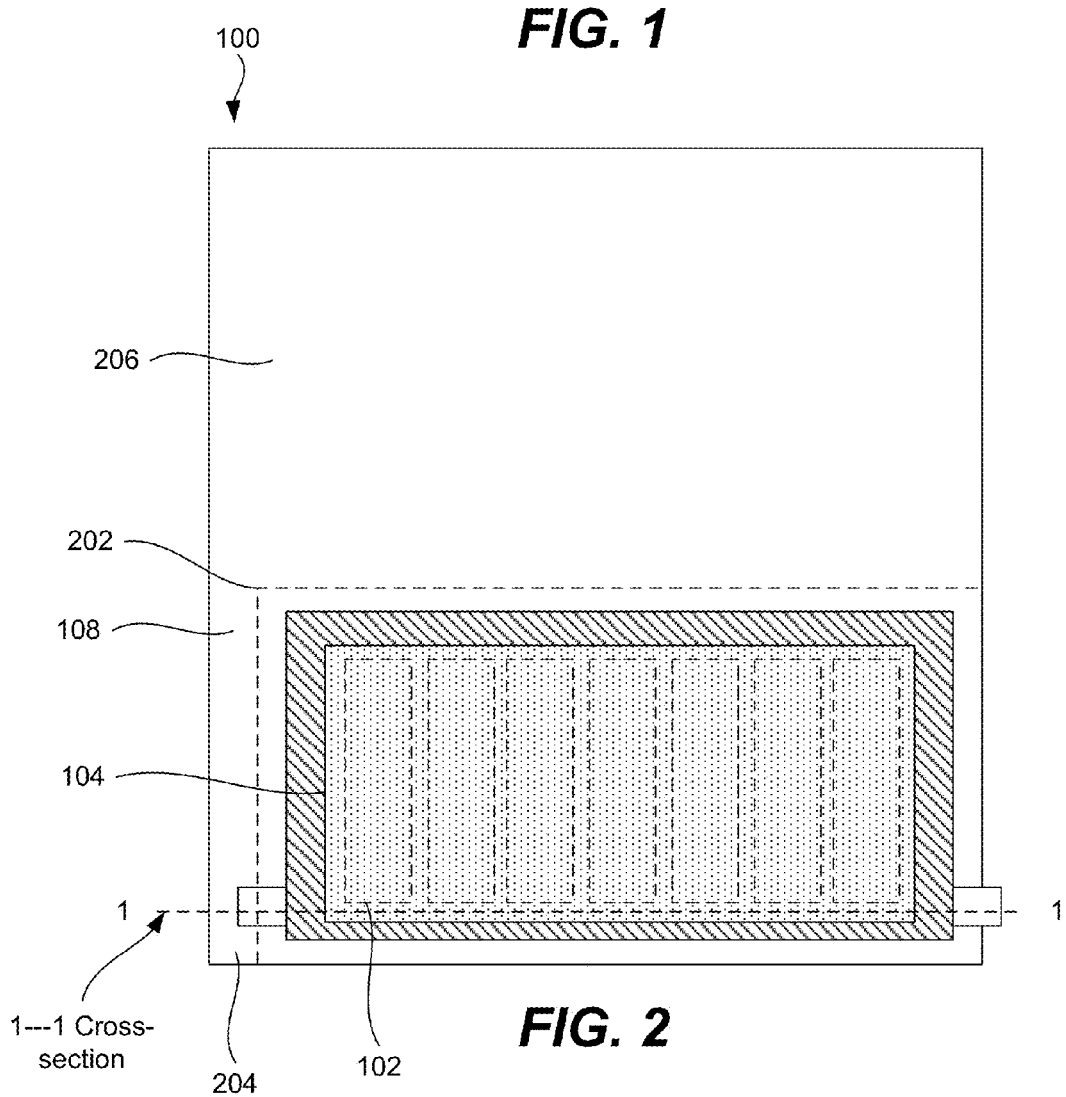
FIG. 2 is a schematic top view of a BIP module in accordance with certain embodiments.

FIG. 2 is a schematic top view of BIP module 100 in accordance with certain embodiments. Support sheet 108 is shown to have a side skirt 204 and a top flap 206 extending beyond a BIP module boundary 202. Side skirt 204 is sometimes referred to as a side flap, while top flap 206 is sometimes referred to as a top lap. In certain embodiments, BIP module 100 does not include side flap 204. BIP module boundary 202 is defined as an area of BIP module 100 that does not extend under other BIP modules or similar building materials (e.g., roofing shingles) after installation. BIP module boundary 202 includes photovoltaic cells 102. Generally, it is desirable to maximize the ratio of the exposed area of photovoltaic cells 102 to BIP module boundary 202 in order to maximize the "working area" of BIP module 100. It should be noted that, after installation, flaps of other BIP modules typically extend under BIP module boundary 202. In a similar manner, after installation, side flap 204 of BIP module 100 may extend underneath another BIP module positioned on the left (in the same row) of BIP module 100 creating an overlap for moisture sealing. Top flap 206 may extend underneath one or more BIP modules positioned above BIP module 100. Arrangements of BIP modules in an array will now be described in more detail with reference to FIGS. 3 and 4.

Figure 3:
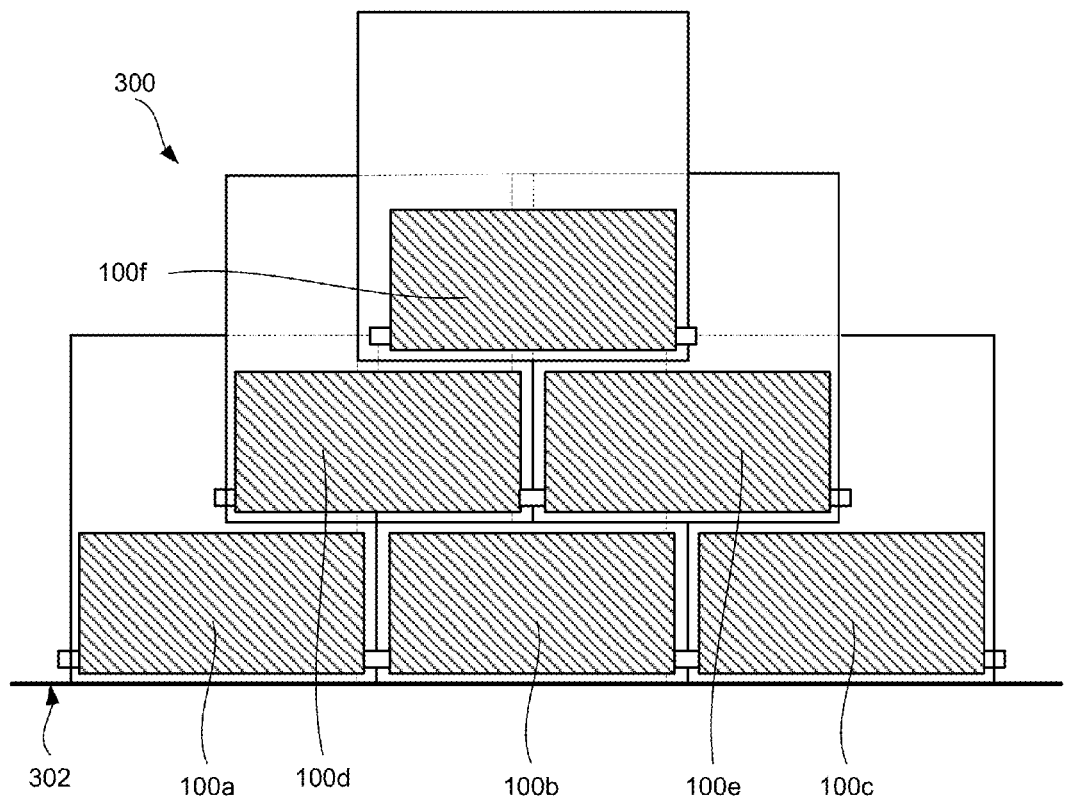
FIG. 3 illustrates a subset of a photovoltaic array that includes six BIP modules in accordance with certain embodiments.

FIG. 3 illustrates a photovoltaic array 300 or, more specifically a portion of a photovoltaic array, which includes six BIP modules 100a-100f arranged in three different rows extending along horizontal rooflines in accordance with certain embodiments. Installation of BIP modules 100a-100f generally starts from a bottom roofline 302 so that the top flaps of BIP modules 100a-100f can be overlapped with another row of BIP modules. If a side flap is used, then the position of the side flap (i.e., a left flap or a right flap) determines which bottom corner should be the starting corner for the installation of the array. For example, if a BIP module has a top flap and a right-side flap, then installation may start from the bottom left corner of the roof or of the photovoltaic array. Another BIP module installed later in the same row and on the right of the initial BIP module will overlap the side flap of the initial BIP module. Furthermore, one or more BIP modules installed in a row above will overlap the top flap of the initial BIP module. This overlap of a BIP module with a flap of another BIP module creates a moisture barrier.

Figure 4:
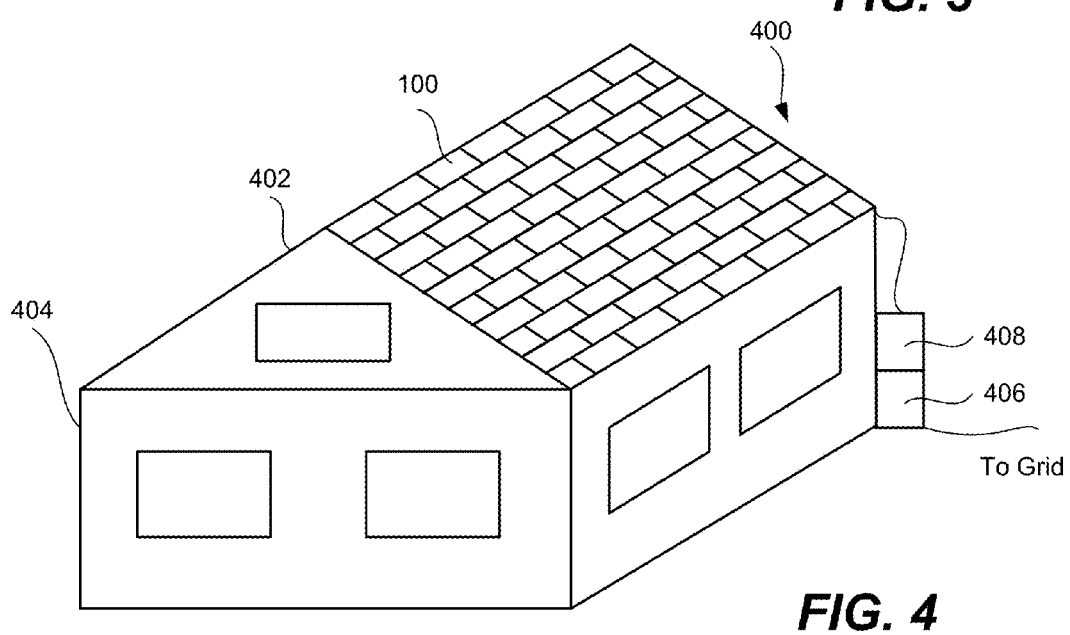
FIG. 4 is a schematic illustration of a photovoltaic array installed on a rooftop of a building structure in accordance with certain embodiments.

FIG. 4 is a schematic illustration of a photovoltaic array 400 installed on a rooftop 402 of a building structure 404 for protecting building structure 404 from the environment as well as producing electricity in accordance with certain embodiments. Multiple BIP modules 100 are shown to fully cover one side of rooftop 402 (e.g., a south side or the side that receives the most sun). In other embodiments, multiple sides of rooftop 402 are used for a photovoltaic array. Furthermore, some portions of rooftop 402 may be covered with conventional roofing materials (e.g., asphalt shingles).

As such, BIP modules 100 may also be used in combination with other roofing materials (e.g., asphalt shingles) and cover only a portion of rooftop. Generally, BIP modules 100 may be used on steep sloped to low slope rooftops. For example, the rooftops may have a slope of at least about 2.5-to-12 or, in many embodiments, at least about 3-to-12.

Multiple BIP modules 100 may be interconnected in series and/or in parallel with each other. For example, photovoltaic array 400 may have sets of BIP modules 100 interconnected in series with each other (i.e., electrical connections among multiple photovoltaic modules within one set), while these sets are interconnected in parallel with each other (i.e., electrical connections among multiple sets in one array). Photovoltaic array 400 may be used to supply electricity to building structure 404 and/or to an electrical grid. In certain embodiments, photovoltaic array 400 includes an inverter 406 and/or a battery pack 408. Inverter 406 is used for converting a direct current (DC) generated by BIP modules 100 into an alternating current (AC). Inverter 406 may be also configured to adjust a voltage provided by BIP modules 100 or sets of BIP modules 100 to a level that can be utilized by building structure 404 or by a power grid. In certain embodiments, inverter 406 is rated up to 600 volts DC input or even up to 1000 volts DC, and/or up to 10 kW power. Examples of inverters include a photovoltaic static inverter (e.g., BWT10240-Gridtec 10, available from Trace Technologies in Livermore, Calif.) and a string inverter (e.g. Sunny Boy RTM.2500 available from SMA America in Grass Valley, Calif.). In certain embodiments, BIP modules may include integrated inverters, i.e., "on module" inverters. These inverters may be used in addition to or instead of external inverter 406. Battery pack 408 is used to balance electric power output and consumption.

Figure 5:
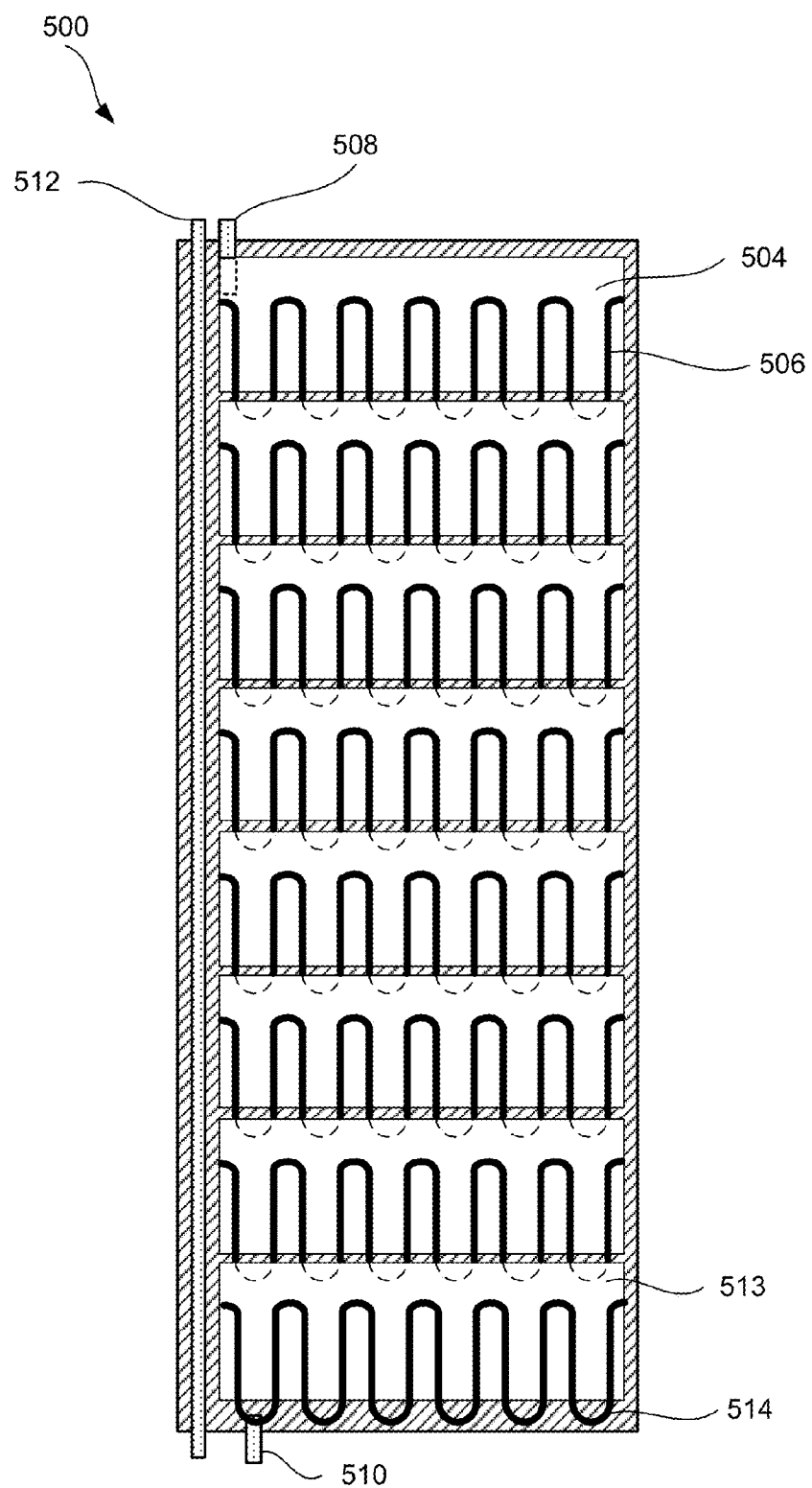
FIG. 5 is a schematic representation of a photovoltaic module having electrically interconnected photovoltaic cells in accordance with certain embodiments.

FIG. 5 is a schematic representation of a photovoltaic module insert 500 illustrating photovoltaic cells 504 electrically interconnected in series using current collectors/interconnecting wires 506 in accordance with certain embodiments. Often individual cells do not provide an adequate output voltage. For example, a typical voltage output of an individual CIGS cell is only between 0.4V and 0.7V. To increase voltage output, photovoltaic cells 504 may be electrically interconnected in series for example, shown in FIG. 5 and/or include "on module" inverters (not shown). Current collectors/interconnecting wires 506 may also be used to provide uniform current distribution and collection from one or both contact layers.

As shown in FIG. 5, each pair of photovoltaic cells 504 has one interconnecting wire positioned in between the two cells and extending over a front side of one cell and over a back side of the adjacent cell. For example, a top interconnecting wire 506 in FIG. 5 extends over the front light-incident side of cell 504 and under the back side of the adjacent cell. In the figure, the interconnecting wires 506 also collect current from the TCO layer and provide uniform current distribution, and may be referred to herein as current collectors. In other embodiments, separate components are used to for current collection and cell-cell interconnection. End cell 513 has a current collector 514 that is positioned over the light incident side of cell 513 but does not connect to another cell. Current collector 514 connects cell 513 to a bus bar 510. Another bus bar 508 may be connected directly to the substrate of the cell 504 (i.e., the back side of cell 504). In another embodiment, a bus bar may be welded to a wire or other component underlying the substrate. In the configuration shown in FIG. 5, a voltage between bus bars 508 and 510 equals a sum of all cell voltages in insert 500. Another bus bar 512 passes through insert 500 without making direct electrical connections to any photovoltaic cells 504. This bus bar 512 may be used for electrically interconnecting this insert in series without other inserts as further described below with reference to FIG. 6. Similar current collectors/interconnecting wires may be used to interconnect individual cells or set of cells in parallel (not shown).

Figure 6:
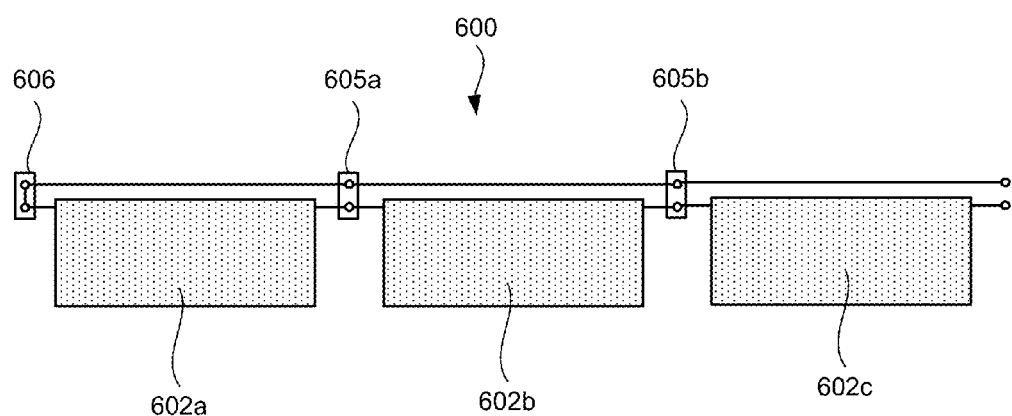
FIG. 6 is a schematic electrical diagram of a photovoltaic array having three BIP modules interconnected in series in accordance with certain embodiments.

BIP modules themselves may be interconnected in series to increase a voltage of a subset of modules or even an entire array. FIG. 6 illustrates a schematic electrical diagram of a photovoltaic array 600 having three BIP modules 602a-602c interconnected in series using module connectors 605a, 605b, and 606 in accordance with certain embodiments. A voltage output of this three-module array 600 is a sum of the voltage outputs of three modules 602a-602c. Each module connector 605a and 605b shown in FIG. 6 may be a combination of two module connectors of BIP modules 602a-602c. These embodiments are further described with reference to FIGS. 8A-8C. In other words, there may be no separate components electrically interconnecting two adjacent BIP modules, with the connection instead established by engaging two connectors installed on the two respective modules. In other embodiments, separate connector components (i.e., not integrated into or installed on BIP modules) may be used for connecting module connectors of two adjacent modules.

Module connector 606 may be a special separate connector component that is connected to one module only. It may be used to electrically interconnect two or more conductive elements of the same module connector.

Figure 7:
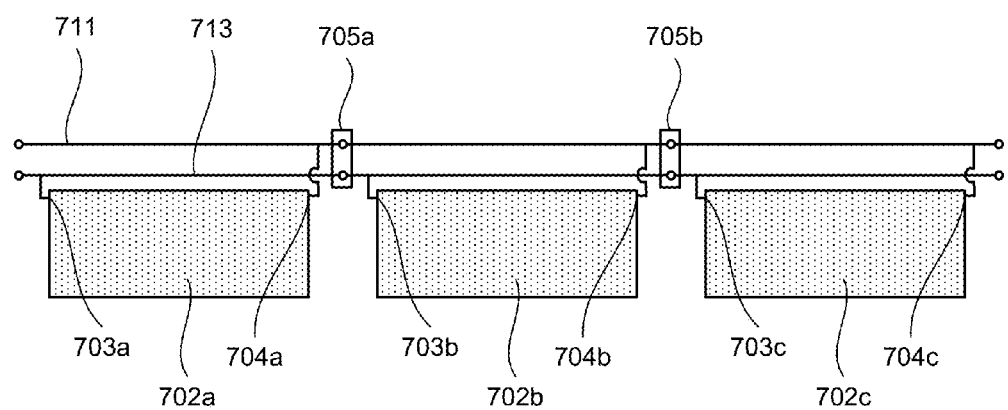
FIG. 7 is a schematic electrical diagram of another photovoltaic array having three BIP modules interconnected in parallel in accordance with other embodiments.

Sometimes BIP modules may need to be electrically interconnected in parallel. FIG. 7 illustrates a schematic electrical diagram of a photovoltaic array 700 having three BIP modules 702a-702c interconnected in parallel using module connectors 705a and 705b in accordance with certain embodiments. Each module may have two bus bars extending through the module, i.e., a "top" bus bar 711 and a "bottom" bus bar 713 as shown in FIG. 7. Top bus bars 711 of each module are connected to right electrical leads 704a, 704b, and 704c of the modules, while bottom bus bars 713 are connected to left electrical leads 703a, 703b, and 703c. A voltage between the top bus bars 711 and bottom bus bars 713 is therefore the same along the entire row of BIP modules 702a-702c.

FIG. 8A is a schematic cross-sectional side view of two connectors 800 and 815 configured for interconnection with each other, in accordance with certain embodiments. For simplicity, the two connectors are referred to as a female connector 800 and a male connector 815. Each of the two connectors 800 and 815 is shown attached to its own photovoltaic insert, which includes photovoltaic cells 802 and one or more sealing sheets 804. Connectors 800 and 815 include conductive elements 808b and 818b, respectively, which are shown to be electrically connected to photovoltaic cells 802 using bus bars 806 and 816, respectively.

In certain embodiments, a conductive element of one connector (e.g., conductive element 808b of female connector 800) is shaped like a socket/cavity and configured for receiving and tight fitting a corresponding conductive element of another connector (e.g., conductive element 818b of male connector 815). Specifically, conductive element 808b is shown forming a cavity 809b. This tight fitting and contact in turn establishes an electrical connection between the two conductive elements 808b and 818b. Accordingly, conductive element 818b of male connector 815 may be shaped like a pin (e.g., a round pin or a flat rectangular pin). A socket and/or a pin may have protrusions (not shown) extending towards each other (e.g., spring loaded tabs) to further minimize the electrical contact resistance by increasing the overall contact area. In addition, the contacts may be fluted to increase the likelihood of good electrical contact at multiple points (e.g., the flutes guarantee at least as many hot spot asperities of current flow as there are flutes).

In certain embodiments, connectors do not have a cavity-pin design as shown in FIGS. 8A-8C. Instead, an electrical connection may be established when two substantially flat surfaces contact each other. Conductive elements may be substantially flat or have some topography designed to increase a contact surface over the same projection boundary and/or to increase contact force at least in some areas. Examples of such surface topography features include multiple pin-type or rib-type elevations or recesses.

In certain embodiments, one or more connectors attached to a BIP module have a "touch free" design, which means that an installer cannot accidently touch conductive elements or any other electrical elements of these connectors during handling of the BIP module. For example, conductive elements may be positioned inside relatively narrow cavities. The openings of these cavities are too small for a finger to accidently come in to contact with the conductive elements inside the cavities. One such example is shown in FIG. 8A where male connector 815 has a cavity 819b formed by connector body 820 around its conductive pin 818b. While cavity 819b may be sufficiently small to ensure a "touch free" designed as explained above, it is still large enough to accommodate a portion of connector body 810 of female connector 800. In certain embodiments, connector bodies 810 and 820 have interlocking features (not shown) that are configured to keep the two connectors 800 and 815 connected and prevent connector body 810 from sliding outs of cavity 819b. Examples of interlocking features include latches, threads, and various recess-protrusion combinations.

FIG. 8B is schematic plan view of female connector 800 and male connector 815, in accordance with certain embodiments. Each connector 800, 815 is shown with two conductive elements (i.e., conductive sockets 808a and 808b in connector 800 and conductive pins 818a and 818b in connector 815). One conductive element (e.g., socket 808b and pin 818b) of each connector is shown to be electrically connected to photovoltaic cells 802. Another conductive element of each connector 800, 815 may be connected to bus bars (e.g., bus bars 809 and 819) that do not have an immediate electrical connection to photovoltaic cells 802 of their respective BIP module (the extended electrical connection may exist by virtue of a complete electrical circuit).

As shown, sockets 808a and 808b may have their own designated inner seals 812a and 812b. Inner seals 812a and 812b are designed to provide more immediate protection to conductive elements 808a and 818a after connecting the two connectors 800, 815. As such, inner seals 812a and 812b are positioned near inner cavities of sockets 808a and 808b. The profile and dimensions of pins 818a and 818b closely correspond to that of inner seals 812a and 812b. In the same or other embodiments, connectors 800, 815 have external seals 822a and 822b. External seals 822a and 822b may be used in addition to or instead of inner seals 812a and 812b. Various examples of seal materials and fabrication methods are described below in the context of FIG. 9. FIG. 8C is schematic front view of female connector 800 and male connector 815, in accordance with certain embodiments. Connector pins 818a and 818b are shown to have round profiles. However, other profiles (e.g., square, rectangular) may also be used for pins 818a and 818b and conductive element cavities 808a and 808b.

Figure 9A:
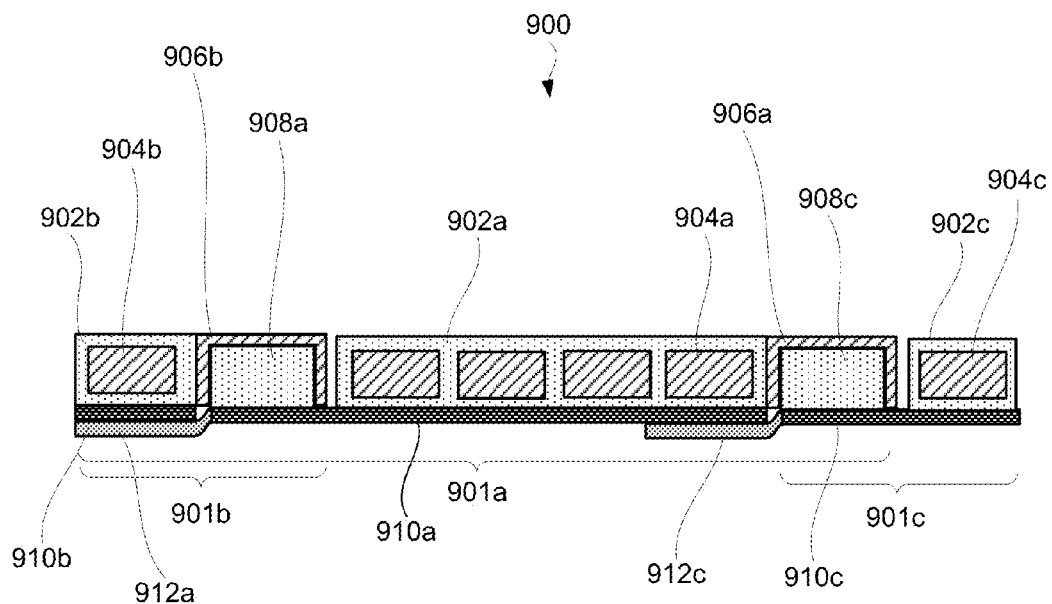
FIG. 9A is a schematic representation of three interconnected building integrable photovoltaic (BIP) modules in accordance with certain embodiments.

To provide a better understanding of various interconnection and interlocking features, multiple building integrable photovoltaic (BIP) modules are shown in some of the following figures. Modules are shown in both final interconnected positions, as in FIGS. 9A and 9D, and intermediate installation stages, as in FIGS. 9B, 9C, 10A, and 12. FIG. 9A is a schematic representation of three interconnected BIP modules 901a, 901b, and 901c in accordance with certain embodiments. Each module in this assembly may be identical, having a channel and a protrusion member for connecting to other modules. For simplicity, only portions of modules 901b and 901c are shown. One having ordinary skill in the art would understand that additional modules similar to ones shown could be added to this assembly and interconnected in a similar manner.

Specifically, BIP module 901a is shown having a channel 906a and a protrusion member 908a. Channel 906a may include an electrical connector for connecting to a corresponding connector attached to a protrusion member 908c of an adjacent module 901c. Similarly, protrusion 908a may have an electrical connector attached to it for connecting to a corresponding connector position within channel 906b of another adjacent module 901b. Various examples of electrical connections positioned within the channels and attached to the protrusions of the modules are described further below. A portion of BIP module 901b is shown having a channel 906b fit over protrusion member 908a of module 901a. A portion of BIP module 901b not shown in FIG. 9A may include a protrusion member similar to protrusion member 908a of module 901a, which may be inserted into a channel of another module. A portion of BIP module 901c is shown having a protrusion 908c inserted into channel 906a of module 901a. A portion of BIP module 901c not shown in this figure includes a channel similar to channel 906a of module 901a, which may be fit over inserted into a channel of yet another module. Overall, these BIP modules may be used to form an extended row of interconnected modules. Special end connectors, which have only channels or protrusion members but no photovoltaic modules, may be used for connecting to end modules of the row.

BIP modules 901a, 901b, and 901c have one or more photovoltaic cells 904a, 904b, and 904c sealed within the modules. Various examples of photovoltaic cells and interconnection methods are described above. In specific embodiments, each of BIP modules 901a, 901b, and 901c has at least 10 CIGS or other type of photovoltaic cells interconnected in series.

Mechanical and electrical connections between modules 901a and 901b and between modules 901a and 901c are provided interconnecting corresponding channels and protrusion members. These features and installation techniques will now be described in more detail in the context of module 901a. Channel 906a is mechanically attached to a photovoltaic insert 902a, which encloses photovoltaic cells 904a. In certain embodiments, channel 906a is formed as a part of insert 902a, for example during forming an insert overmold. Alternatively, insert 902a may be a separate component from channel 906a. Channel 906a may be mechanically connected to insert 902a by a separate overmold, a support sheet, or some other module component.

Channel 906a may be made from a rigid material or a semi-rigid material. Rigidity may be needed to secure channel 906a over protrusion member 908c, which in turn secures module 901a with respect to module 901c. At the same time, some flexibility may be needed to provide a snug fit between channel 906a and protrusion member 908c and/or for interlocking and other features as explained below in the context of FIGS. 10A, 10B, and FIG. 12. Channel 906a is generally made from rigid polymer materials, some examples of which are presented above. In other embodiments, channel 906a may be made from flexible materials. Some examples of flexible materials include polyethylene, polypropylene, thermoplastic olefins, thermoplastic rubber, thermoplastic elastomer, ethylene propylene diene, monomer (EPDM), fluoroelastomers or thermoplastic vulcanizates (TPV), and flexible cast thermoset materials, such as urethanes or silicones. In general, various flexible thermoplastic elastomers that have suitable thermally durable behavior may be used. Some specific examples include SANTOPRENE® (Supplied by Exxon Mobil in Houston, Tex.). HIPEX® (Supplied by Sivaco in Santa Clara, Calif.), EFLEX® (Supplied by E-Polymers Co., Ltd. In Seoul, Korea), ENFLEX® (Supplied by Enplast Limited in Longford, Ireland), EXCELINK® (Supplied by JSR Corporation in Tokyo, Japan), SYNOPRENE® (Supplied by Synoprene Polymers Pvt. Ltd. in Mumbai, India), ELASTRON® (Supplied by Elastron Kimya in Kocaeli, Turkey).

Channel 906a has an opening configured for receiving and snugly fitting over protrusion member 908c of module 901c. The opening typically faces in a downward direction, i.e., facing a building structure or, more specifically, in a direction extending from a front light incident side of photovoltaic cells 904a to their back side. This orientation of channel 906a together prevents moisture from collecting in channel 906a during operation. Furthermore, this orientation coupled with a snug fit and a corresponding upward orientation of protrusion member 908c helps to establish a moisture tight seal when modules 901a and 901c are interconnected. For rectangular profiles of channel 906a, the snug fit may be along all inner sides of the channel or at least along two vertical sides.

Channel 906a is generally positioned along one edge of insert 902a (e.g., a short edge of a rectangular insert), while protrusion member 908a is positioned along an opposite edge. This configuration allows forming a row of interconnected modules. In certain embodiments, a module has two channels and two protrusion members for connecting with modules in adjacent rows. For example, one protrusion member may be positioned along a short edge and another protrusion member positioned along a long edge.

Protrusion member 908a is also attached to photovoltaic insert 902a and extends upward, i.e., away from a building structure. In certain embodiments, an extension member 910a is used to provide this attachment. Extension member 910a may be a portion of a support sheet, a sealing sheet, an overmold, or other module component extending beyond the photovoltaic cell boundaries. In certain embodiments, protrusion member 908a is formed together with extension member 910a. In more specific embodiments, protrusion member 908a is integrated with an overmold of photovoltaic insert 902a and, even more specifically, with channel 906a formed on another side of insert 902a. Protrusion member 908a may be made from various rigid and/or flexible polymer materials, such as the one listed above. Protrusion member 908a may be a solid block (as shown in FIG. 9A) or a hollow channel. The hollow channel may be specifically configured to collect water in between two connected modules and deliver it down the roof. As such, electrical connectors are typically positioned in the top portions of the channel and/or protrusion. Furthermore, protrusion member 908a may be one continuous channel or bar or a set of separate channels or bars extending along one line.

In certain embodiments, a BIP module includes a side moisture flap 912a (also referred to as a side skirt) attached to extension member 910a and configured to extend under an adjacent BIP module, e.g., module 901b in FIG. 9A. For example, extension member 910a may extend beyond protrusion member 908a and form side moisture flap 912a. In the same or other embodiments, side moisture flap 912a is a part of a support sheet, a sealing sheet, or an overmold. Side moisture flap 912a may be used to improve a moisture seal in between two modules, e.g., modules 901a and 901b in FIG. 9A. In other embodiments, a BIP module does not have a side moisture flap, and a moisture seal is provided by interconnecting a protrusion member with a channel. Regardless of presence or absence of a side moisture flap, a BIP module may include a top moisture flap. The top moisture flap is discussed in more detail above.

Figure 9B:
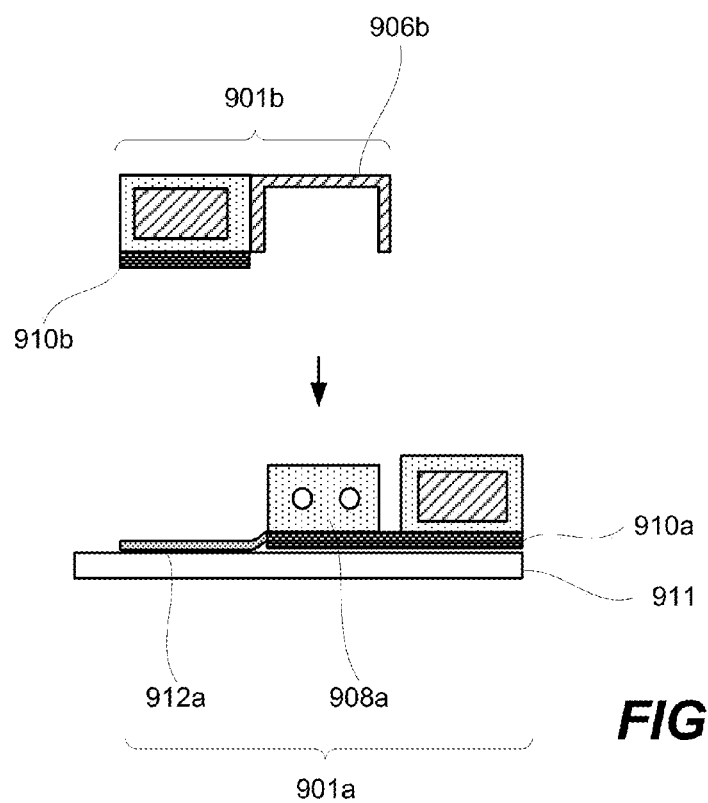
FIG. 9B is a schematic representation of two BIP modules prior to interconnecting in accordance with certain embodiments.

As stated above, a protrusion member is configured to snugly fit into a channel of an adjacent module. FIG. 9B is a schematic side view of two BIP modules 901a and 901b prior to fitting protrusion member 908a of module 901a into channel 906b of module 901b in accordance with certain embodiments. At this stage, a module with an unconnected protrusion member (i.e., module 901a in FIG. 9B) may be fixed to a building structure 911. For example, a top moisture flap, a moisture flap 912a, extension member 910a, a portion of the support sheet, and/or any other module components may be nailed, screwed, glued, or otherwise mechanically attached to building structure 911. After the fitting, the second module (i.e., module 901b in FIG. 9B) is also attached to building structure 911.

Fitting protrusion member 908a into channel 906b generally involves positioning module 901b above module 901a and aligning channel 906b with respect to protrusion member 908a. Module 901b is then pushed down such that protrusion member 908a is inserted into channel 906b. This insertion may involve flexing one or more portions of protrusion member 908a and/or channel 906b and/or interlocking protrusion member 908a with respect to channel 906b. These features are described below in more detail.

A BIP module has at least two electrical connectors. One may be aligned with and extend in the same direction as protrusion member 908a and another one may be positioned within channel 906a. These connectors are referred to as a "protrusion connector" and a "channel connector." A protrusion connector may be, but does not need to be, a part of protrusion member 908a or attached to protrusion member 908a. A channel connector may be, but does not need to be, a part of channel 906a. However, a channel connector will generally be positioned inside channel 906a.

In certain embodiments, conductive elements of protrusion and channel connectors of adjacent cells are substantially parallel surfaces facing each other during fitting of the protrusion member into the corresponding channel. Conductive elements may also be one or more sets of pins and cavities extending in a direction substantially parallel to an insertion direction. In these embodiments, pushing down the channel into the protrusion member establishes an electrical connection between the conductive elements.

In other embodiments, conductive elements are one or more sets of pins and cavities extending in a direction substantially parallel to the channel. In these embodiments, in addition to inserting a protrusion member into a channel, the channel needs to be slid with respect to the protrusion member to establish an electrical connection between the conductive elements. These embodiments will now be explained in more details in context of FIGS. 9C and 9D.

Figure 9C:
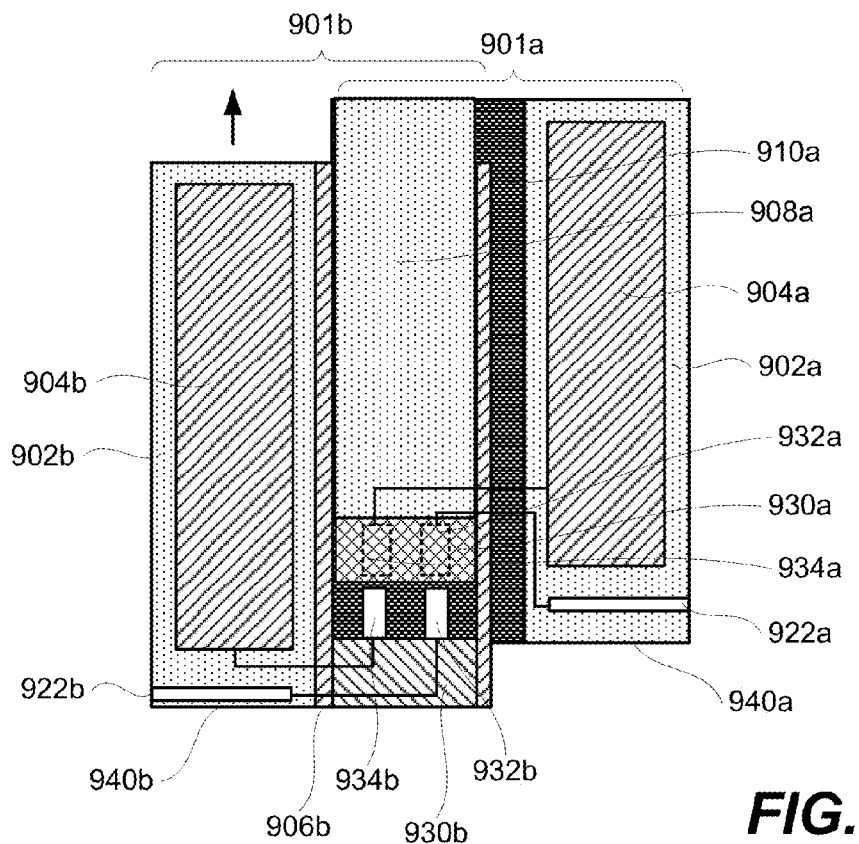
FIG. 9C is a schematic top view of two BIP modules prior to establishing electrical connections between conductive elements of one module with conductive elements another module in accordance with certain embodiments.
Figure 9D:
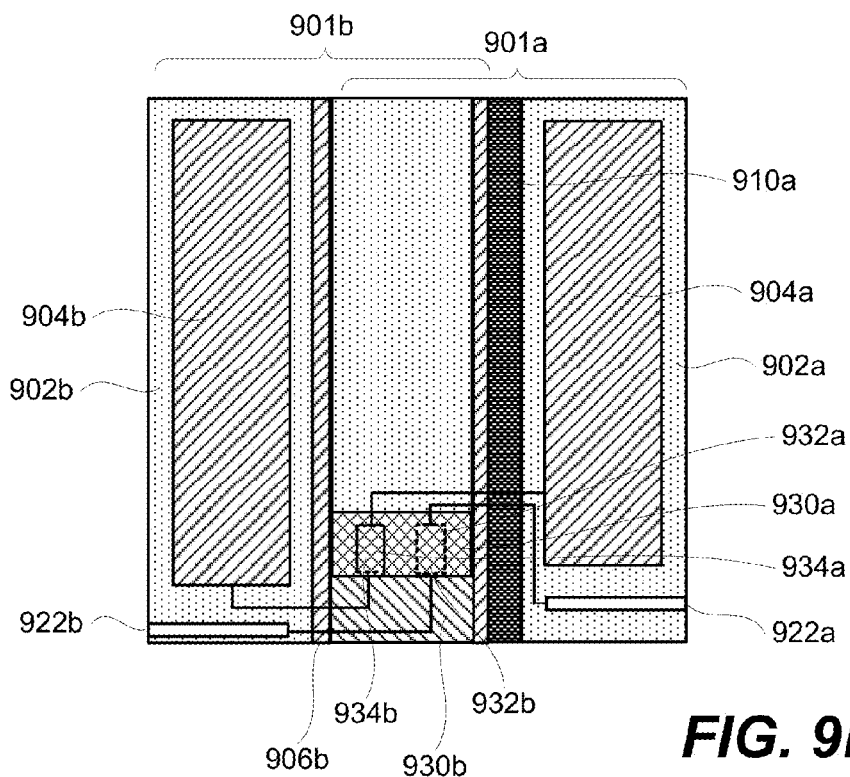
FIG. 9D is a schematic top view of two BIP modules after establishing electrical connections between conductive elements of one module with conductive elements another module in accordance with certain embodiments.

FIG. 9C is a schematic top view of two BIP modules 901a and 901b prior to establishing electrical connections between conductive elements 932a and 934a of module 901a with conductive elements 932b and 934b of module 901b in accordance with certain embodiments. A portion of BIP module 901b is shown having a channel connector 930b positioned within channel 906b. Channel connector 930b has two conductive elements 932b and 934b. In general, a channel connector or a protrusion connector may have any number of conductive elements (e.g., one, two, three, or four). One conductive element 934b is connected to photovoltaic cell 904b. Another conductive element 932b is connected to bus bar 922b. Bus bar 922b may not be in direct electrical communication with any photovoltaic cells of module 901b. Other connection schemes are possible. To prevent accidental touching of conductive elements during handling and installation, pin-type conductive elements that extend outside of connector bodies may be a part of a channel connector and extend within the channel as shown in FIG. 9C (conductive elements 932b and 934b). In other embodiments, the touch-free feature is provided by sockets and protections positioned around the pins of the respective connectors.

A portion of BIP module 901a is shown having a protrusion connector 930a attached to protrusion member 908a. Protrusion connector 930a also has two conductive elements 932a and 934a that correspond to and designed to interconnect with conductive elements 932b and 934b. In the example shown in FIGS. 9C and 9D, conductive element 934a is connected to photovoltaic cell 904a, while another conductive element 932a is connected to bus bar 922a. Like bus bar 922b, bus bar 922a may not be directly electrically connected to any photovoltaic cells of module 901a. Other connection schemes are also possible.

During insertion of protrusion member 908a into channel 906b, channel connector 930b is offset with respect to protrusion connector 930a to allow for pin-type conductive elements, i.e., conductive elements 932b and 934b in FIG. 9C, to extend in between the two connector bodies. As such, modules 901a and 901b may be initially misaligned with respect to each other during the insertion/fitting operation. This is shown in FIG. 9C. Later, in order to establish electrical connections between conductive elements 932b and 934b and conductive elements 932a and 934a, module 901b is slid along the channel length with respect to module 901a into a new position shown in FIG. 9D. This sliding causes pin-type conductive elements 932b and 934b to be inserted into cavity-type conductive elements 932a and 934a and form two corresponding electrical connections.

Figure 10A:
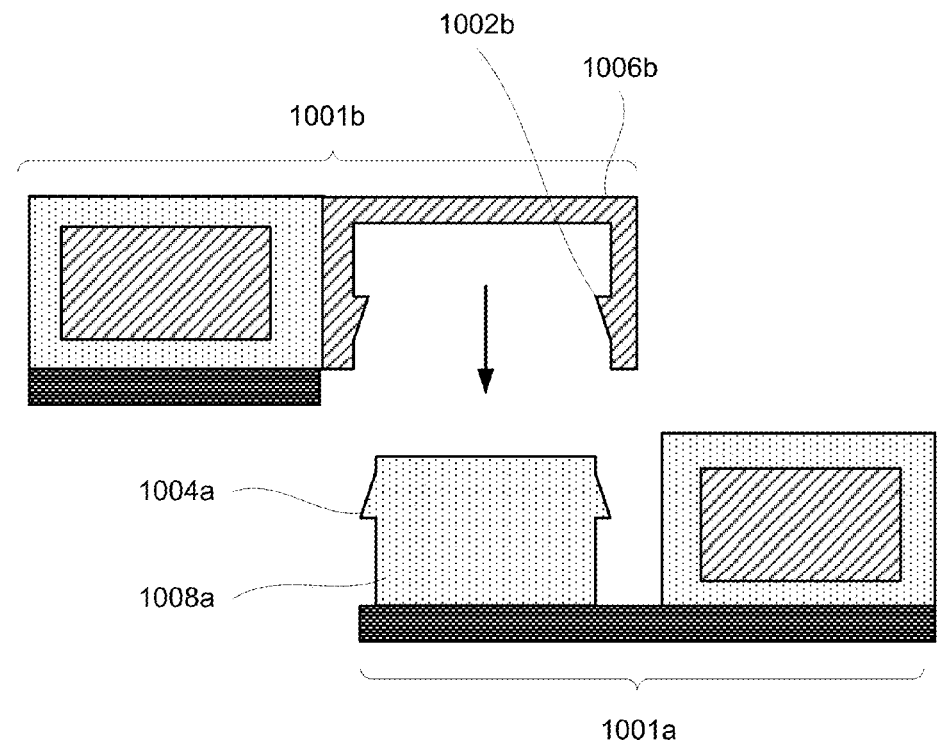
FIG. 10A is a side schematic view of a channel having a set of retaining feature and a protrusion member having a set of retaining features in accordance with certain embodiments.

Photovoltaic arrays built from BIP modules may be subjected to various mechanical forces caused by winds, deformations of supporting building structures, temperature fluctuations, and other causes. To prevent an interconnected assembly including a protrusion member and a channel from separating, the protrusion member and/or the channel may have retaining features. FIG. 10A illustrates one example of such features. In this example, a channel 1006b has a set of retaining features 1002b positioned on and extending from each side of channel 1006b. A protrusion member 1008a may have a corresponding set of retaining features 1004a, which may extend from side walls of protrusion member 1008a. Retaining features 1004a may be positioned on a connector body or other components of the protrusion. Retaining features 1004a and 1002b are configured to interlock with each other when protrusion member 1008a is inserted into channel 1006b. Once interlocked, retaining features 1004a and 1002b prevent protrusion member 1008a from sliding out of channel 1006b.

Figure 10B:
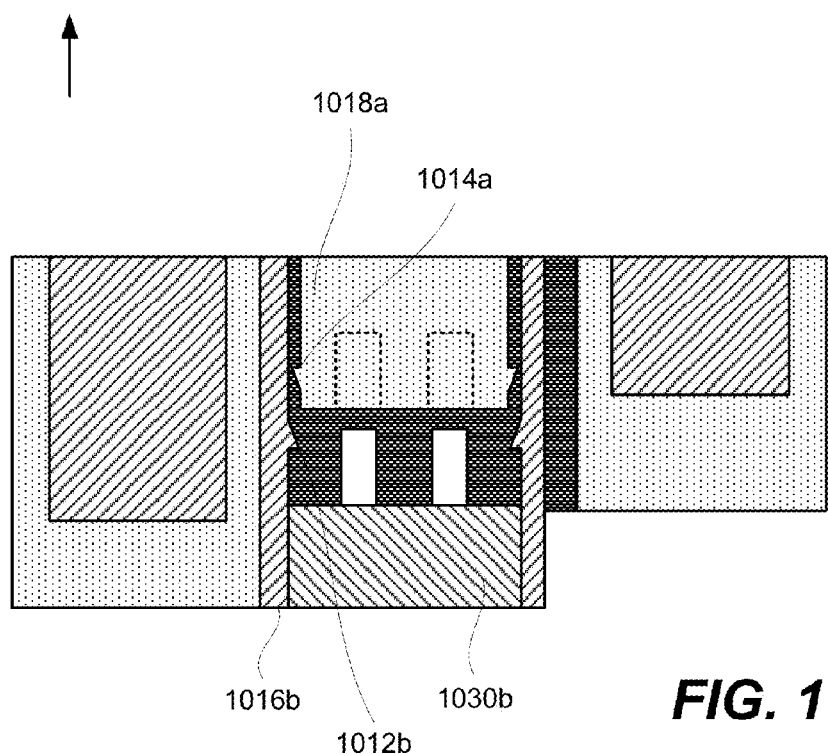
FIG. 10B is a top schematic view of a channel having a set of retaining feature and a protrusion member having a set of retaining features in accordance with certain embodiments.

Furthermore, in order to prevent a protrusion member from sliding within a channel, another type of retaining features may be used. FIG. 10B is a top schematic view of a channel 1016b having a set of retaining feature 1012b and a protrusion member 1018a having a set of retaining features 1014a in accordance with certain embodiments. When protrusion member 1018a is advanced toward a connector 1030b (e.g., to make electrical contacts between corresponding conductive elements), retaining feature 1012b interlocks with retaining feature 1014a and prevent protrusion member 1018a from sliding away from connector 1030b. These features may be used to maintain the electrical connections as well as alignment of the modules. This type of retaining features may be used in combination with other types of retaining features, e.g., features described above in the context of FIG. 10A. Retaining features may be also positioned on photovoltaic inserts, overmold, extension members, support sheets, sealing sheets, and other module components.

Figure 11:
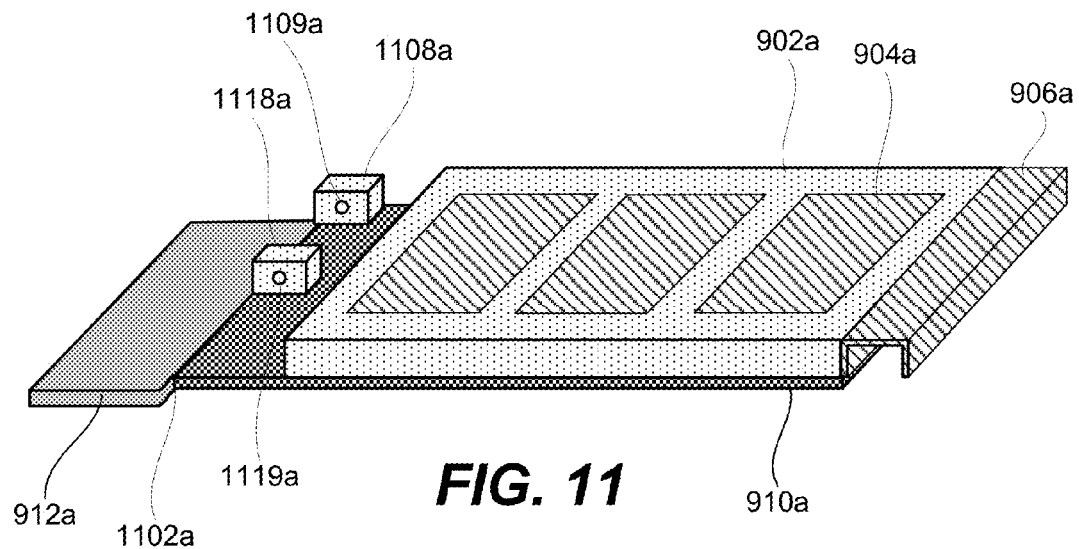
FIG. 11 is a schematic perspective view of two protrusion connectors arranged along a side of the photovoltaic insert in accordance with certain embodiments.

In certain embodiments, a BIP module has two or more protrusion connectors and two or more channel connectors. For example, a channel may be too small to accommodate multiple conductive elements on one connector and multiple connectors may be used for this purpose. FIG. 11 is a schematic perspective view of two protrusion connectors 1108a and 1118a arranged along one side 1102a of photovoltaic insert 902a in accordance with certain embodiments. Each of protrusion connectors 1108a and 1118a may have one or more conductive elements, e.g., a conductive element 1109a of protrusion connector 1108a and a conductive element 1119a of protrusion connector 1118a as shown in FIG. 11. Protrusion connectors 1108a and 1118a may collectively form a protrusion member or may be separate elements from a protrusion member. If multiple protrusion connectors are used, such as protrusion connectors 1108a and 1118a, spacing in between connectors allows a channel connector to fit in. Channel 906a may have similar channel connectors (not visible in FIG. 11A) for connecting to protrusion connectors of an adjacent BIP module during installation.

In certain embodiments, protrusion and channel connectors have "touch proof" designs. Conductive elements of these connectors are protected by various insulative components from accidental touching during handling and installation of the BIP module. For example, a protrusion connector may have one or more socket-type conductive elements. These sockets may be sufficiently small, while the conductive elements may be tucked away from the socket entries. At the same time, a channel connector may have one or more pin-type conductive elements extending away from the connector body. However, an opening of the channel carrying this channel connector may be sufficiently small such that the pin can not be accidently touch by reaching through the opening. At the same time, a protrusion connector may be small enough to fit into this opening.

Figure 12:
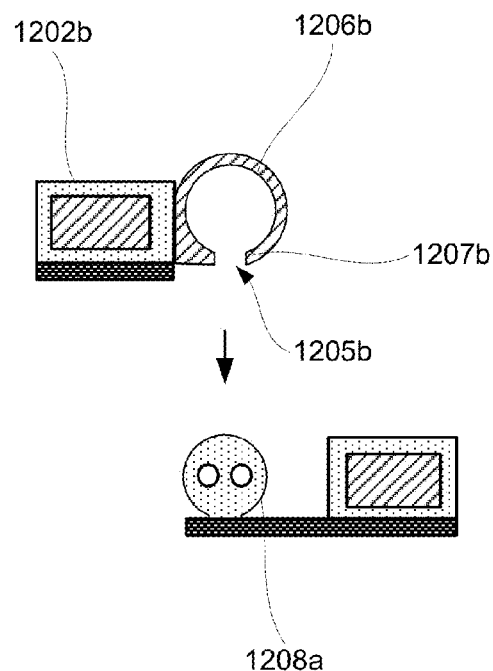
FIG. 12 is a schematic side view of a flexible channels with a narrow opening configured for receiving a wider protrusion member in accordance with certain embodiments.

In certain embodiments, a channel has an opening that is smaller than a maximum cross-sectional width of a protrusion member. In order for the protrusion member to fit through this opening, one or more portions of the channel and/or protrusion member flex. FIG. 12 is a schematic side view of a flexible channel 1206b with a narrow opening 1205b configured for receiving a wider protrusion member 1208a in accordance with certain embodiments. Flexible channel 1206b may allow for an edge 1207b moving away from insert 1202b making opening 1205b temporarily wider.

This in turn will allow for protrusion member 1208*a* to pass through opening 1205*b*. Edge 1207*b* may then flex back towards insert 1202*b* to establish a snug fit between protrusion member 1208*a* and channel 1206*b*. Edge 1207*b* may also serve as a retaining feature to prevent protrusion member 1208*a* from sliding out of channel 1206*b*.

Figure 13:
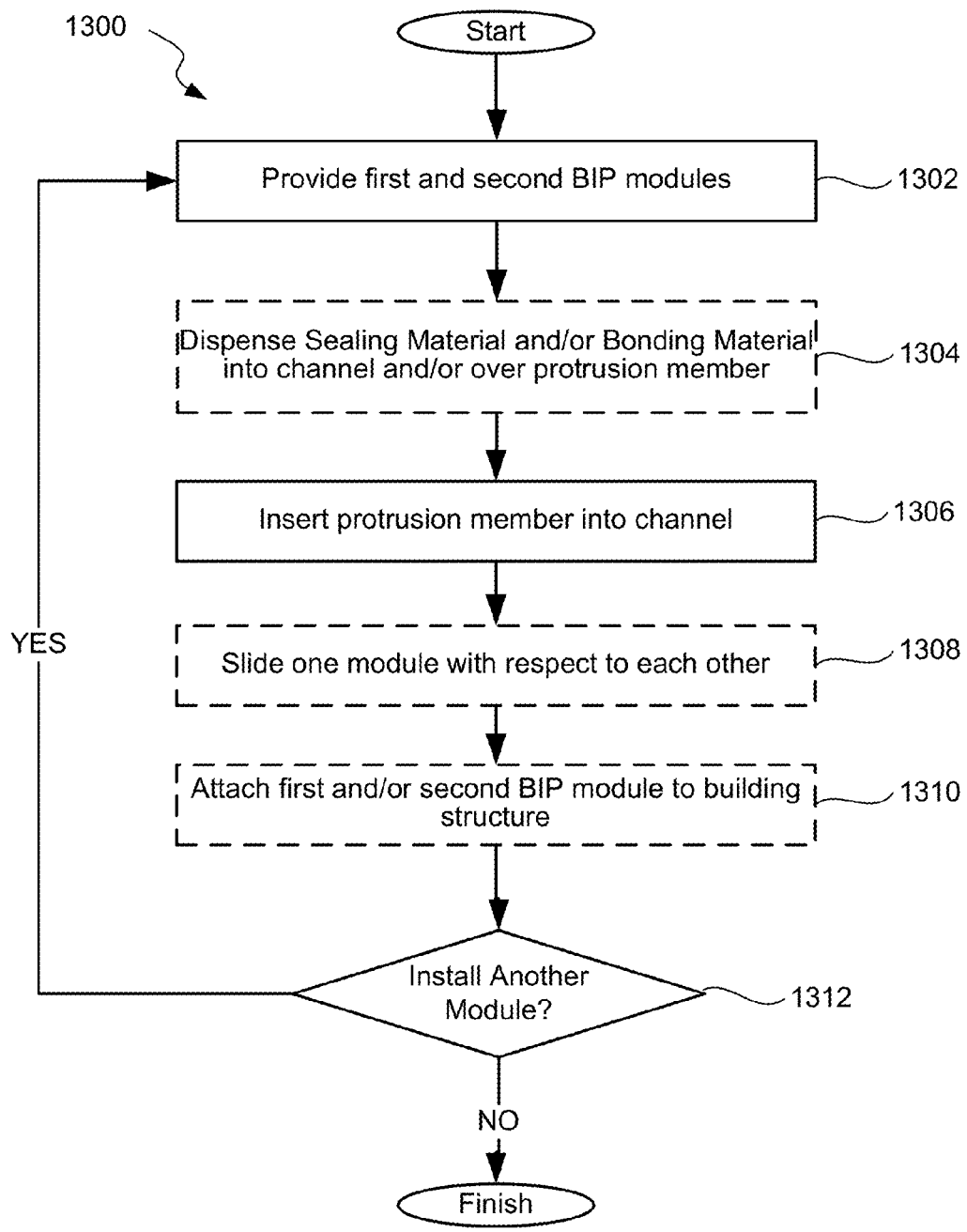
FIG. 13 is a flowchart corresponding to a process for installing an array of building integrable photovoltaic modules in accordance with certain embodiments.

FIG. 13 is a flowchart corresponding to a process 1300 for installing an array of BIP modules in accordance with certain embodiments. Process 1300 may start with providing two BIP modules, i.e., a first module and a second module, in operation 1302. Various examples of BIP modules are described above. The first module with an exposed protrusion member may be attached to a building structure and/or one or more other BIP modules. In certain embodiments, a sealing and/or bonding materials (e.g., silicone based materials) are dispensed over the protrusion member of the first module and/or into the channel of the second module during an optional operation 1304.

Process 1300 may continue with inserting the protrusion member of the first module into the channel of the second module in operation 1306. The channel may be first aligned with respect to the protrusion member such that the channel is parallel to and above the protrusion member. In certain embodiments, the second module may be offset with respect to the first module to accommodate electrical connectors. The channel is then pushed over the protrusion member to establish a snug fit between the two.

In certain embodiments, one or more electrical connections between protrusion and channel connectors are established during operation 1306. In other embodiments, the channel is slid with respect to the protrusion member to establish such electrical connections in an optional operation 1308. As described above in context of FIGS. 10A and 10B, operation 1306 and/or operation 1308 may also involve interlocking the channel and the protrusion members to prevent one moving with respect to another in at least certain directions.

Process 1300 may proceed with attaching one or both modules to the building structure in an optional operation 1310. For example, a top moisture flap and/or a side moisture flap of the second module (or both modules) may be nailed, screwed, glued, or otherwise attached to the building structure. Various operations of process 1300 may be repeated for one or more other BIP modules to form a row of mechanically and electrically interconnected BIP modules (decision block 1312)

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A building integrable photovoltaic module comprising:
    a photovoltaic insert comprising one or more photovoltaic cells having a front light incident side and a back side, the photovoltaic insert comprising a first edge and a second edge, wherein the first edge is opposite of the second edge;
    a channel at the first edge of the photovoltaic insert, the channel having an opening having a width and a length and facing in a downward direction extending from the front light incident side to the back side, wherein the channel is capable of sliding along a length of an adjacent protrusion member of a first adjacent building integrable photovoltaic module while the opening of the channel is physically engaged with the adjacent protrusion member of the first adjacent building integrable photovoltaic module;
    a first channel electrical connector positioned within the channel and comprising a first channel conductive element in electrical communication with the one or more photovoltaic cells;
    a protrusion member at the second edge of the photovoltaic insert and facing an upward direction, opposite of the downward direction, the protrusion member having a width and a length with first and second ends located at opposing ends of the protrusion member along its length, wherein the length of the protrusion member is capable of sliding along a length of an opening of a channel of a second adjacent building integrable photovoltaic module while physically engaged with the opening of the channel of the second adjacent building integrable photovoltaic module;
    a first protrusion electrical connector comprising a first protrusion conductive element in electrical communication with the one or more photovoltaic cells, the first protrusion electrical connector attached to the protrusion member, wherein the first protrusion electrical connector is capable of slidingly engaging a second channel electrical connector positioned within the opening of the channel of the second adjacent building integrable photovoltaic module for making an electrical connection to the second adjacent building integrable photovoltaic module and the first channel electrical connector is capable of slidingly engaging a second protrusion electrical connector positioned at an end of the protrusion member of the first adjacent building integrable photovoltaic module for making an electrical connection to the first adjacent building integrable photovoltaic module,
    wherein the first channel conductive element comprises a male conductive element that extends out of the first channel electrical connector in a direction along the length of the channel.

2. The building integrable photovoltaic module of claim 1, wherein the channel is capable of interlocking with the adjacent protrusion member of the first adjacent building integrable photovoltaic module in an installed position to prevent the channel from sliding with respect to the adjacent protrusion member of the first adjacent building integrable photovoltaic module in the upward direction and/or in a direction parallel to the first edge.

3. The building integrable photovoltaic module of claim 1, wherein the one or more of the channel and the protrusion member comprises one or more interlocking features.

4. The building integrable photovoltaic module of claim 1, further comprising a side moisture flap capable of extending under the second adjacent building integrable photovoltaic module.

5. The building integrable photovoltaic module of claim 1, wherein one or more parts of the channel and/or of the protrusion member are flexible.

6. The building integrable photovoltaic module of claim 1, wherein the opening of the channel is smaller than a maximum cross-sectional width of the protrusion member.

7. The building integrable photovoltaic module of claim 1, wherein the first channel electrical connector comprises a second channel conductive element not directly connected to the one or more photovoltaic cells.

8. The building integrable photovoltaic module of claim 1, wherein the male conductive element is a pin extending out of the first channel electrical connector in a direction along the length of the channel.

9. The building integrable photovoltaic module of claim 1, wherein the male conductive element comprises a conductive surface along the length of the opening of the channel, and wherein the first protrusion conductive element comprises a conductive surface facing in an outward direction from the end of the protrusion member.

10. The building integrable photovoltaic module of claim 1, wherein the first protrusion connector is integrated with the protrusion member.

11. The building integrable photovoltaic module of claim 1, wherein the channel is a part of an overmold formed around the photovoltaic insert.

12. The building integrable photovoltaic module of claim 1, wherein the first protrusion electrical connector is a female connector.

* * * * *